United States Patent [19]
Ward

[11] Patent Number: 5,207,208
[45] Date of Patent: May 4, 1993

[54] INTEGRATED CONVERTER HIGH POWER CD IGNITION

[75] Inventor: Michael A. V. Ward, Arlington, Mass.

[73] Assignee: Combustion Electromagnetics Inc., Arlington, Mass.

[21] Appl. No.: 900,068

[22] Filed: Jun. 16, 1992

Related U.S. Application Data

[63] Continuation-in-part of Ser. No. 755,795, Sep. 6, 1991, abandoned.

[51] Int. Cl.⁵ .............................................. F02P 3/06
[52] U.S. Cl. ................................. 123/596; 123/598; 123/620
[58] Field of Search ............... 123/596, 598, 620, 605, 123/604, 650, 652, 653, 654, 655, 656; 313/138, 141, 143; 315/209 CD, 209 T; 363/16, 21

[56] References Cited

U.S. PATENT DOCUMENTS

| | | | |
|---|---|---|---|
| 3,780,343 | 12/1973 | Stonham | 123/596 |
| 3,906,919 | 9/1975 | Asik et al. | 123/596 |
| 4,017,780 | 4/1977 | Cowatt, Jr. | 363/16 |
| 4,317,068 | 2/1982 | Ward et al. | 315/209 CD |
| 4,457,285 | 7/1984 | Hamai et al. | 123/605 |
| 4,589,398 | 5/1986 | Pate et al. | 123/596 |
| 4,868,730 | 9/1980 | Ward | 363/21 |
| 5,049,786 | 9/1991 | Gotisar et al. | 315/209 T |

Primary Examiner—Raymond A. Nelli
Attorney, Agent, or Firm—Jerry Cohen

[57] ABSTRACT

A high power high energy capacitive discharge (CD) ignition system for internal combustion engines using a separate resonating inductor (7) in the discharge circuit which is constructed and arranged to provide suitable operation of the discharge circuit and to allow coupling of energy from a voltage source (13a) for storage in the inductor (7) for delivery to the CD system discharge capacitor (4) during the operation of the ignition to help maintain energy during the preferred mode of multiple spark pulse firings of an ignition spark in a preferred large toroidal gap spark plug and to recharge the capacitor (4) between firings.

25 Claims, 4 Drawing Sheets

INTEGRATED CONVERTER HIGH POWER CD IGNITION

BACKGROUND OF THE INVENTION AND PRIOR ART

This application is a continuation-in-part of my co-pending U.S. patent application Ser. No. 07/755,795, filed Nov. 6, 1991, now abandoned.

The present invention relates to the very high power and high energy (VHE) ignition for internal combustion (IC) engines for improving engine emissions and fuel economy. The invention employs improved and simplified forms of ignition circuitry including novel integrated power converter and improved spark plug structure of the very high power and high energy (VHE) type disclosed in several prior patents and patent applications, including U.S. Pat. No. 4,677,960 on voltage doubling, U.S. Pat. No. 4,774,914 on piston firing, U.S. Pat. No. 4,841,925 on enhanced toroidal gap ignition, U.S. patent application Ser. No. 07-350,945 on high efficiency and high output coils, and U.S. patent application Ser. No. 07-684595 on distributorless capacitive discharge ignition. Some of the key background features disclosed in these patents and applications, and employed to varying degrees by the present invention, include voltage doubling as disclosed in U.S. Pat. No. 4,677,960, the split coil disclosed in application Ser. No. 07-350,945, and the toroidal gap spark plug of U.S. Pat. No. 4,841,925, among others.

The present invention has particular application to conventional lean burn engines, two stroke engines, and engines employing alternative fuels, e.g. alcohol fuels, where improved igniting ability is important. Present and prior investigators have failed to realize the full benefits of these applications in part because of the lack of truly powerful ignitions. All standard ignitions and conventional high energy ignitions, e.g. HEI, are based on the Kettering ignition with its limited spark currents of 50 to 200 milliamps (ma) and spark power of 5 to 25 watts, versus 2000 ma and 200 watts of VHE ignition. On the other hand, VHE ignition disclosed in the above references has somewhat higher complexity and cost relative to state-of-the-art ignition systems.

The technology of ignition systems are discussed in several texts including more notably in: "Internal Combustion Engines and Air Pollution" by Edward F. Obert (Intext Educational Publishers 1973) and in the manual "Bosch Automotive Electric/Electronic Systems" (Robert Bosch GmbH 1988).

SUMMARY OF THE INVENTION

The present invention provides simplified and improved designs, constructions, and methods of applying VHE ignition, characterized in part by the use of voltage doubling with pulsating sparks of peak current of about two amps delivered by a split coil system and a toroidal gap spark plug. The system is contemplated for use in both OEM and retrofit applications, where the simplifying features (of the VHE ignition) disclosed herein make it more readily usable in cars with older engines (both small and large engines) with relatively simple controls, i.e. distributors with simple controlled timing, or in newer engines with electronic controls, to provide fuel economy and emissions improvements.

Principal features of the invention include: (a) a considerably simplified and universal form of power converter which is integrated in a unique way into the discharge circuit; (b) the separate leakage or resonating inductor of the split coil of the VHE ignition discharge circuit used as the main energy injecting element of the converter; (c) simplification of the distributorless version of VHE ignition by using a small series gap with the spark plug and by use of the more optimized "pulsed flame discharge ignition (PFDI)" spark plug disclosed in U.S. Pat. No. 4,841,925, which has now been adjusted to take advantage of its far greater, i.e. 200 times greater, fouling resistance when used with the preferred VHE ignition; (d) simplified operation with distributor type ignition including improved discharge circuitry; and (e) improved spark plug constructions.

It is therefore a principal object of the present invention to provide a simplified and more effective internal combustion engine ignition based on features of VHE ignition that improve the potential of lean burn. The present invention builds on developments of the approximately last decade disclosed in the referenced patents and applications, but goes beyond all of them to realize the elegance and simplicity of the Kettering ignition where energy storage and delivery and high voltage are operated in what is essentially a single circuit, but in the present case with far greater power, energy capability, and versatility through the application of different operating principles.

The series of developments on which the present invention builds begins with the voltage doubling ignition invention. This ignition led to the substantially higher power and energy delivery to the spark, which was partly realized by the development of a toroidal gap spark plug, a more effective and efficient means of delivering energy to the air-fuel mixture. The amount of energy delivered was enhanced by development of a higher efficiency, higher power resonant converter working with an energy recharge circuit. Further efficiency and energy delivery gains were made by the use of improved SCRs and development of a fast-turn-off circuit with a smaller snubber. The overall system was then further especially for distributorless ignition where a considerable size reduction was achieved, by the development of the split coil where the coil high voltage and energy delivery functions were separated and optimized separately. And finally, further size reduction and efficiency gains were made by the realization of shunting part of the split coil resonating inductor during the initial spark pulse firing (where the system is preferably fired in a multi-sparking mode for better energy delivery to the mixture and initial flame).

These developments led to a system with far greater igniting power, i.e. with approximately ten times the igniting power and energy of conventional ignitions. But despite the many improvements, including size reductions, the system was still larger, more expensive, and more complicated than common automobile ignition embodiments of the Kettering system, and had energy delivery limitations for higher compression ratio (CR) or boosted engines which limited power and energy delivery to less than the desired ten times factor.

The present invention represents the realizations of some remaining goals of: 1) further size reduction; 2) higher energy delivery capability through the improved toroidal gap spark plug combined with the integrated converter (realized through advantageous use of the separate resonating inductor for injecting energy into the discharge circuit); 3) higher energy delivery under higher pressure through the improved spark plug; 4)

power circuit simplification and versatility through the use of the integrated converter; and 5) discharge circuit simplification by use of a series gap in distributorless ignitions.

Finally, the present integrated converter gives the ignition great versatility in terms of requirements of type and level of voltage source for powering the ignition, although for low voltage sources its efficiency is compromised because of the need of a series diode in the power stage. For lower power retrofit distributor type ignition applications the system can be operated with the basic very simplified integrated converter comprised of two switches and a diode (operating with a voltage source, e.g. a battery and the resonating inductor).

The system is explained in further detail and other objects, features, and advantages of the invention will be apparent from the following detailed description of preferred embodiments given, by way of example, in conjunction with the accompanying drawings.

DESCRIPTION OF PREFERRED EMBODIMENTS

Figure 1:
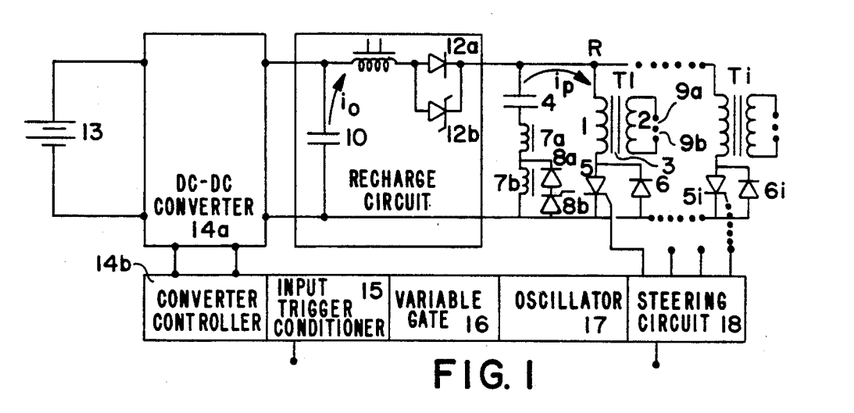
FIG. 1 is a circuit block diagram including some detailed circuitry of a preferred embodiment of the VHE ignition including a series gap spark plug for permitting implementation of a simple form of the distributorless ignition.

FIG. 1 is a circuit block diagram of the VHE ignition system depicting a single compact coil T1 of a possible arbitrary number of compact coils T1 with a primary winding 1, secondary winding 2, and magnetic core 3. The coil is part of a capacitor discharge circuit with capacitor 4, SCR 5 and shunt diode 6, and separate leakage or resonating inductor Le shown in two sections 7a and 7b, where inductor section 7b is shunted by combination fast diode 8a and SCR 8b as disclosed in U.S. patent application Ser. No. 07-684595 for increasing the open circuit frequency to permit use of smaller coils (Ti). The output of the coil includes a small series "hold-off" gap 9a in series with the spark plug gap 9b to permit cascading of coils Ti using shunt diodes 6i, instead of switches as disclosed and discussed in patent application 07-684595. The small series gap, which is sized to be preferably between 0.02" and 0.04" insures that a minimum of 5 kilovolts is required to fire the gap so that cross-fire can be prevented when coil T1 is fired due to the negative small voltage appearing on rail R, as discussed in the above patent application.

The main elements of the ignition circuit are the DC—DC converter 14a (connected to a battery 13) and its controller 14b, the recharge circuit with capacitor 10, inductor 11, and diode 12a and optional zener diode 12b, input trigger conditioner 15, variable gate 16, and oscillator with stretch 17 for producing the preferred multiple spark pulses per ignition firing of the VHE ignition, and the steering circuit 18 for triggering each SCR 5i of coil Ti in turn, where i=1,2,3, . . . These elements, and their function, are disclosed in patent application 07-684595, excepting for zener diode 12b which may be included to prevent over-voltaging of capacitor 4.

Figure 2:
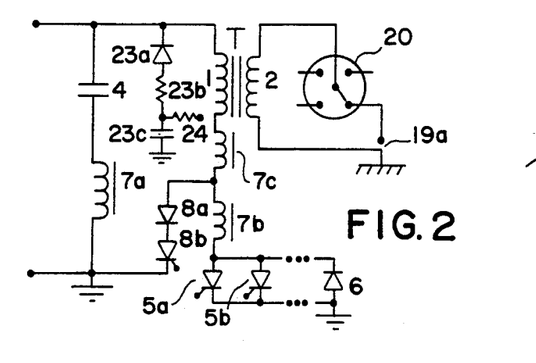
FIG. 2 is a circuit drawing of a distributor version of the VHE ignition with an improved method of by-passing part of the discharge circuit leakage inductor.

FIG. 2 is a preferred embodiment of a distributor type discharge circuit with an improved way of shorting out the resonating inductor comprised of the non-bypassed section 7a located in line with discharge capacitor 4 (and/or in line with the coil primary winding 1 which may comprise the leakage inductance 7c of coil T) and the by-passed section 7b located on the low side of the coil T primary winding 1. Like numerals represent like parts with respect to FIG. 1.

In this preferred distributor type system, with distributor 20 showing one of four connections to a spark gap 19a, the circuit is fired by triggering one or more of paralleled SCRs 5a, 5b, . . . , which may be fired simultaneously or sequentially to reduce SCR heating. However, when implementing the inductor bypass feature of shorting out inductor 7b upon the first (or more) firing of the spark pulses to increase the open circuit discharge circuit frequency, resonating inductor 7b is shorted out by means of SCR/diode pair 8b/8a. In this preferred embodiment, the discharge circuit is completed upon firing SCR 8b (versus having to fire two SCRs simultaneously) to minimize circuit losses and to make more practical the operation of the circuit with the higher current first half discharge cycle (as per patent application 07-684595).

Also shown is the speed-up-turn-off circuit comprised of diode 23a, resistor 23b, capacitor 23c, and resistor 24 which is connected to the gates (triggers) of SCRs 5a, 5b, . . . , to provide negative bias to the gates of the SCRs to speed up their recovery (during the preferred approximately 50 usec half sinusoidal period). The term approximately as used herein means within plus or minus 25% of the value being quoted.

Figure 3A:
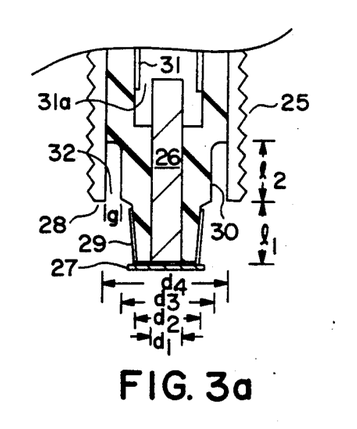
FIGS. 3a and 3b are fragmentary side views of preferred "pulsed flame discharge ignition", or PFDI, spark plugs improved for use with VHE ignition.

FIG. 3a is a fragmentary view of a preferred embodiment of a PFDI type of toroidal gap spark plug suitable for use with this ignition. In this drawing is shown the spark plug shell or threaded section 25, center conductor 26 to which is attached a preferred thin disk electrode 27 which forms a toroidal spark gap with the end of the spark plug shell 28. Protruding "insulating" nose cone 29 is of length l1, and recessed insulating section 30 is of length l2 defining a gap 32 of width "g" of preferably between 0.02" and 0.05" between the outer surface of recess insulating section 30 and the inner surface of the shell 25 at its shell end 28. Also shown is a preferred embodiment of a series gap 31a (disclosed with reference to FIG. 1) between center conductor 26 and larger diameter conductor 31. The larger diameter conductor section 31 can be used to provide higher capacitance in the spark plug, which may be useful, as is known to those versed in the art. The gap 31a may also be placed at the other end of the plug where the high voltage terminal is mounted, or at any other convenient location.

Preferably, for the dimensions shown and assuming a typical long reach 14 mm spark plug, the following values are taken as typical for the present application: l1 between 0.060" and 0.25"; l2 equal to about 0.3" (between 0.15" and 0.6"); d1 approximately 0.1"; d2 approximately 0.22"; d3 approximately 0.28"; and d4 approximately 0.36" to provide a gap (32) g approximately 0.04".

In U.S. Pat. No. 4,841,925 the PFDI spark plug was disclosed, but it was not fully and advantageously implemented in practice because of concerns of fouling of the surface 29, shown in partially fragmentary enlarged form in FIG. 3b. The initial spark discharge 33a tends to locate near or at the surface of nose section 29 (to potentially foul the surface). However, the equivalent resistance of the peak spark discharge Rpl1 for the preferred VHE ignition is about 50 ohms, i.e. the peak current is about 3 amps and the arc burning voltage Varc is about 150 volts. Hence Rpl1 is two hundred times less than the 10,000 ohms equivalent resistance of the standard spark discharge, making the plug 200 times less susceptible to fouling (with VHE ignition). The term "about" as used herein in between one half and twice the value it designates.

Figure 3B:
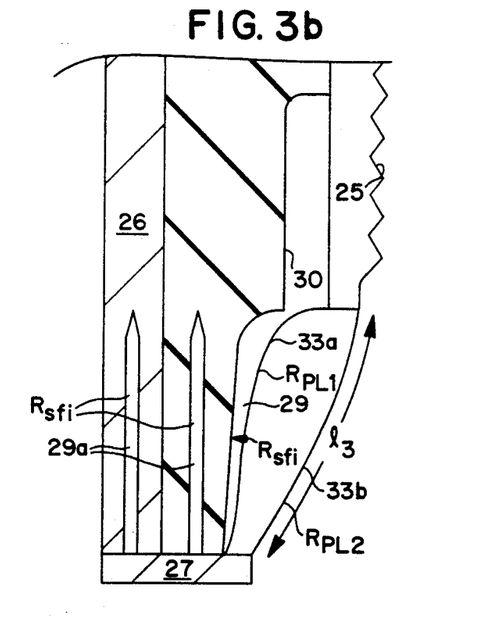

The low value of Rpl1 can be exploited to tolerate some deposition of material on the surface of nose section 29, especially of the metal oxides of high erosion resistant materials such as tungsten whose oxides have a very high resistance. One can even plate the surface with very thin layers, e.g. 0.00001", 29a of semi-conducting material (designated as Rsfi) to provide tracking surfaces of resistance of orders of magnitude greater than Rpl1 to enhance the arc formation process, especially for long arcs, i.e. lengths equal to or greater than ¼ inch. In this way, maximum spark/flame plasma discharge paths 33b of length 13 can be formed with the minimum break-down voltage.

It is further noted that using the principle of bypassing part of the resonating inductance during the initial spark discharge enhances the present process by reducing the rise time and reducing the spark discharge resistance. For example, for a VHE ignition with discharge circuit total leakage or resonating inductor Le of approximately 60 microhenry (uH) and with approximately 4 microfarads (uF) capacitance of (400 volt) capacitor 4, the discharge frequency "fcc" and open circuit frequency "foc" are typically approximately 10 and 30 kilohertz (kHz) respectively for a coil turns ratio N of approximately 50 and a coil primary inductance Lp approximately ten times the leakage inductance Le. By by-passing ⅔ of the leakage inductance Le during the first spark pulse the open circuit frequency foc is doubled (the rise time is halved to less than 8 microseconds) and the arc resistance Rpl1 is approximately halved.

Hence, by using the features of VHE ignition in conjunction with the PFDI spark plug, which is now improved by employing electrode materials and optional precoatings of resistance Rsfi to allow the surface to be acted upon by the arc discharge without premature fouling, one can produce the maximum arc length 13 for a minimum secondary coil high output voltage. This is especially important in engines operating at higher peak cylinder pressures due to the use of boosting of the intake air to improve lean burn engine operation. Tungsten material and certain erosion resistant tungsten alloys, e.g. tungsten-nickel-iron, where tungsten comprises most of the material, are useful electrode material since the material is erosion resistant and its oxides are poor electrical conductors. Since the present system is geared mainly for lean burn applications, both four and two stroke engines, then the combustion atmosphere will contain abundant oxygen to oxidize the material deposited on the plug nose 29 (which is otherwise insulating or semi-conducting). Certain semi-conducting (low resistance) ceramic materials may also be useful in this application.

For the DC—DC converter 14a the resonant converter of U.S. Pat. No. 4,868,730 has been the preferred embodiment. However, for VHE ignition applications where a separate leakage or resonating inductor is used as disclosed in several of the cited patents and patent applications, a novel simplified universal power converter is disclosed.

Figure 4:
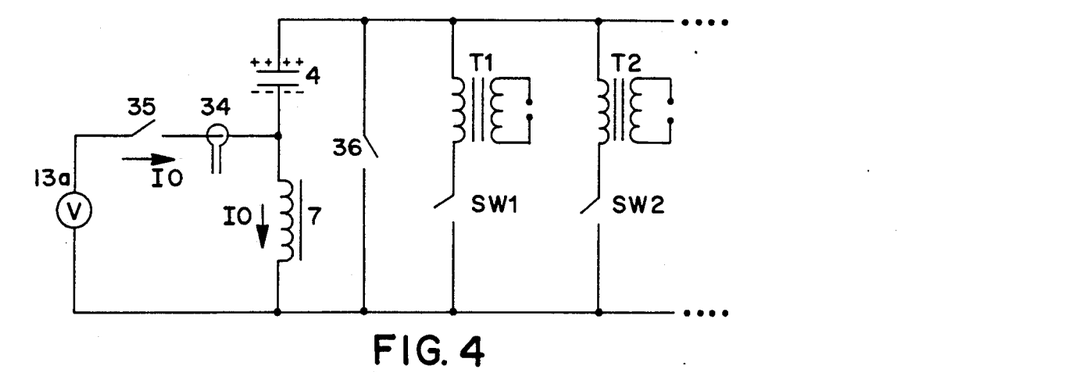
FIG. 4 is a circuit drawing of a novel, simplified, universal "integrated power converter" applied to a VHE ignition in which the leakage or resonating inductor of the discharge circuit is also the main energy storage and energy injecting element of the power converter circuit.

FIG. 4 is a circuit drawing of a capacitive discharge (CD) ignition system with an integrated power converter defined by the power supply 13a, switches 35 and 36, and inductor 7 which comprises part or essentially all of the CD circuit leakage or resonating inductance. Like numerals represent like parts with respect to FIGS. 1 and 2.

In this figure is depicted a distributorless ignition with cascaded ignition coils T1, T2, . . . , with respective switches SW1, SW2, . . . , which are preferably SCRs (5) and shunt diode (6) (as in FIG. 1). Current sensor 34 is an optional sensing element particularly useful where power supply 13a is of variable output, as in a magneto system. Sensor 34 can be used to turn-off switch 35 when a certain level of current IO has been reached (if other control means are not used or if extra protection is required).

In operation, when switch 35 is turned-on, current IO builds up in inductor 7. When switch 35 is turned OFF, current IO finds a path through switch 36 (or through switches SW1, SW2, . . . ) to deliver its (positive) charge to discharge capacitor 4 (to its upper positive plate). Switch 35 may be operated independently of, or in conjunction with, the CD ignition circuit, defined by inductor 7, capacitor 4, and one pair of either coil T1 with switch SW1 or coil T2 with switch SW2, or other cascaded coil/switch combinations. Preferably, integrated converter switch 35 is operated synchronously with the CD circuit during ignition firing to provide some recharging of capacitor 4, and then independently following the ignition period to restore capacitor 4 to its fully charged state.

Figure 5:
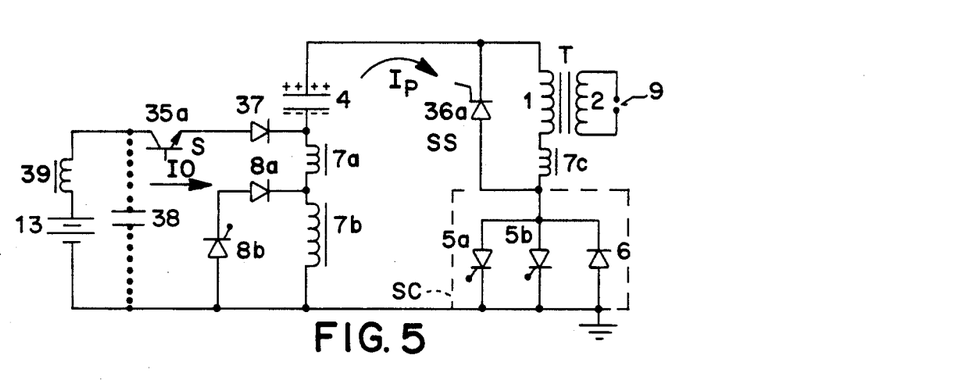
FIG. 5 is a more detailed circuit drawing of an integrated DC—DC power converter for an ignition utilizing a single coil, as in a distributor ignition system or in a system applied to one cylinder of an engine.

FIG. 5 depicts a preferred embodiment of the system of FIG. 4 using a single coil T and assuming a battery 13 for the power supply, with like numerals representing like parts with respect to FIGS. 1,2, and 4. For the switch 35 is assumed a high voltage NPN power transistor 35a with a high voltage, e.g. 600 volt, diode 37 in series with it to protect the transistor from the positive high voltage levels that normally occur during half of the discharge cycle of the CD circuit. A capacitor 38 may be placed between one of the terminals of switch 35a (at the collector) and ground to limit the voltage spike that would otherwise occur during turn-off of switch 35a and to reduce switching losses. Capacitor 38 stores the energy of the inductance 39 of the connecting wires between the battery 13 and switch 35a for a period of time preferably selected (through the value of the capacitance) to correspond to the transistor switching time.

For switch 36, FIG. 4 is assumed an SCR 36a located across the primary winding 1 of the coil T which forms one of two paths with shunt diode 6 for delivery of the energy stored in resonating inductor 7a/7b.

In this preferred embodiment, resonating inductor is shown comprised of two parts, main shunted inductance 7b of value Le1 and unshunted inductance 7a of value Le2. The total inductance Le1 plus Le2 is designated as Le. Leakage inductance 7c (Lpe) of coil T is assumed to be much less than Le. Inductor 7b is shown shunted by SCR/diode pair 8b/8a (as in FIGS. 1 and 2).

Typical component values for this integrated converter VHE ignition CD circuit are: capacitor 4 is approximately 3 uF to 6 Uf charged to approximately 400 volts for a stored energy of approximately 400 millijoules (mj); inductance Le has a preferred value of approximately 50 uH to 120 uH for a preferred discharge period of approximately 100 usecs to 150 usecs; inductance Le1 is typically between 1/9 and ¼ of Le to provide two to three times the normal open circuit frequency (to minimize the core area of coil T as already disclosed).

Figure 6A:
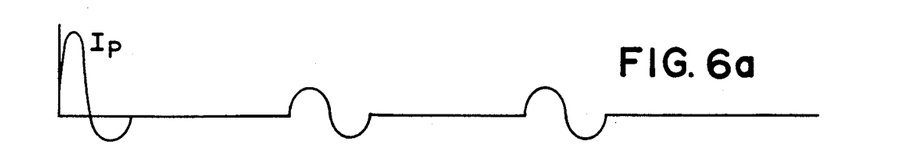
FIG. 6a is a graph of a preferred sequence of primary current pulses Ip of the discharge circuit which allows more optimal use of the integrated converter.
Figure 6B:
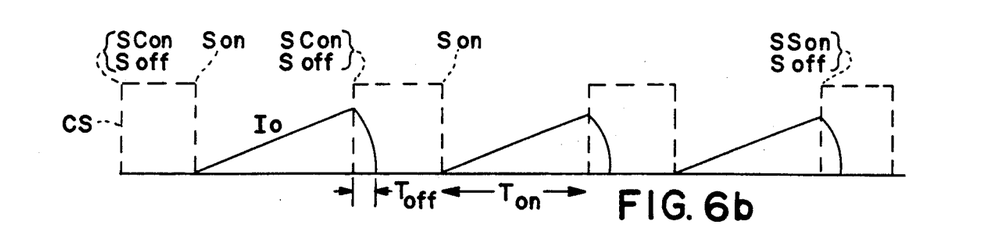
FIG. 6b is a graph of the integrated converter primary current IO with reference to the primary current pulses Ip of FIG. 6, with the discharge circuit control pulses superimposed.

FIGS. 6a and 6b depict, for an assumed inductance of 60 uH for Le, a switch time Ton for switch 35a of approximately 150 usecs the peak current IO of approximately 30 amps for a 14 volt battery 13, representing a stored energy of approximately 25 mj for delivery to capacitor 4. Such a period Ton can be achieved by firing the VHE ignition in a multi-pulsed mode with an approximately 40% duty cycle as shown in FIG. 6a (excepting for the first (half) pulse which has the preferably shorter period due to shunting of inductor 7b). Son and Soff designate switch S turn-on and turn-off, and SCon, SSon designate turn-on of switches SC and SS respectively.

The overall size of the inductor 7 can be changed by changing the size of capacitor 4 for the same discharge period, or by changing the discharge period within constraints of insuring SCR 5a/5b recovery. The integrated converter may be driven by the VHE ignition spark pulsing trigger waveform or by other control means including current sensing to turn switch 35a off when a suitable peak current has been reached. Preferably, the peak of the current IO should be selected to allow an ignition pulse train with an initial 400 volt level to stabilize at some suitable voltage, say 300 volts.

Figure 7:
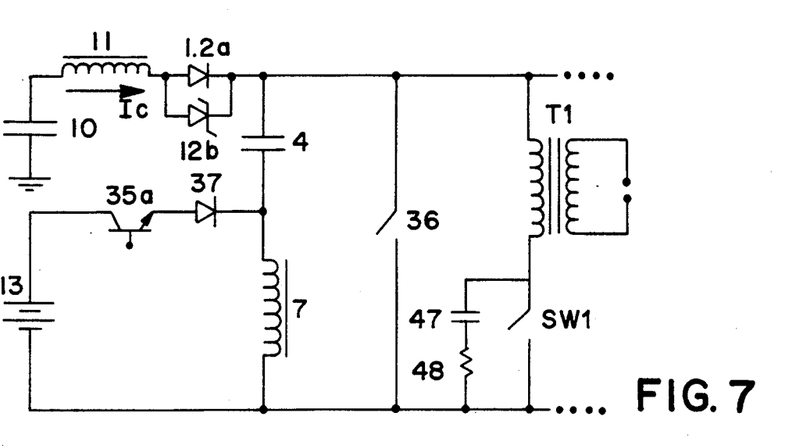
FIG. 7 is a circuit drawing of an integrated converter utilizing a recharge circuit as depicted in FIG. 1.

Many control strategies for the integrated converter are possible, as well as various hybridizations and combinations of it. An example of such a combination is shown in FIG. 7, where like numerals represent like parts with respect to the earlier figures. In this example is shown a recharge circuit as depicted in FIG. 1 comprised of capacitor 10, inductor 11, diode 12a and zener diode 12b. In operation, assuming the fully charged state of capacitor 4 is 400 volts and the zener (24b) voltage is 350 volts, then the recharge circuit can be made to deliver energy during the entire spark firing period to capacitor 4 without drawing any power from the recharging action of the integrated converter once the voltage on capacitor 4 falls below the zener voltage (e.g. 350 volts). After the spark firing, the integrated converter will have enough time to fully charge both capacitors 4 and 10. Note that in this figure are shown a snubber comprised of capacitor 47 and resistor 48 across the switch SW1, as is commonly done in CD circuits.

It is noted that in the circuits depicted herein, various levels of detail and options are shown which can be used in a range of combinations depending on the application, and have been disclosed in the references cited and disclosed herein and may be known to those versed in the art of CD ignition systems.

Figure 8:
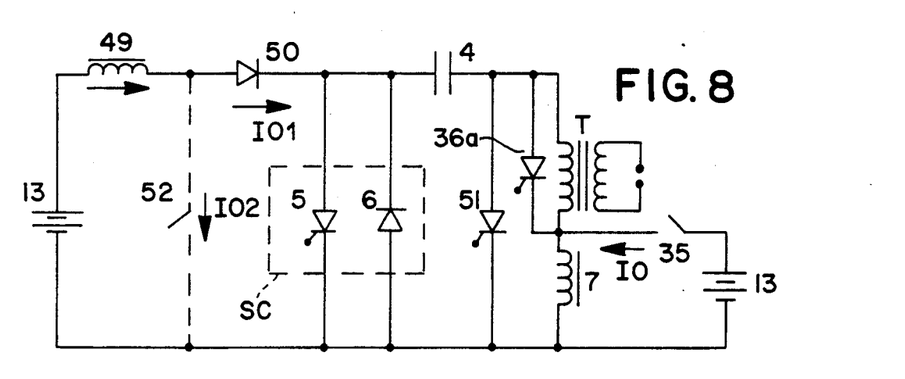
FIG. 8 is a circuit drawing of a synchronous converter in combination with the integrated converter and/or a boost converter derived from the synchronous converter.

Another example of combination/hybridization is depicted in the circuit drawing of FIG. 8, where is shown a case wherein inductive energy storage takes place during the entire spark firing stage (including during the individual spark pulse discharges). This is accomplished by the inclusion of an additional inductor 49 connected in series with the high voltage diode 50 to the discharge circuit switch SC. The topology for the discharge circuit, comprised of capacitor 4, SCR 5, diode 6, resonating inductor 7, and transformer T, is the more common CD circuit (excepting for the inclusion of the resonating inductor 7). An additional switch 51 (SCR shown) is required for the operation of this circuit, which is designated as a synchronous converter since it operates synchronously with the ignition firing. Also shown is the integrated converter comprised of the battery and switch 35 connected to the high side of the resonating inductor 7, and the SCR 36a.

Figure 9A:
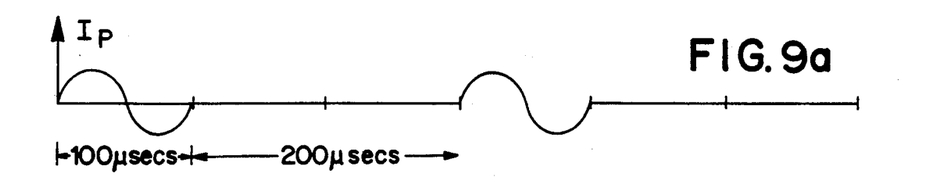
FIGS. 9a and 9b are preferred waveforms versus time of the primary current Ip and converter currents IO, IO1, IO2.
Figure 9B:
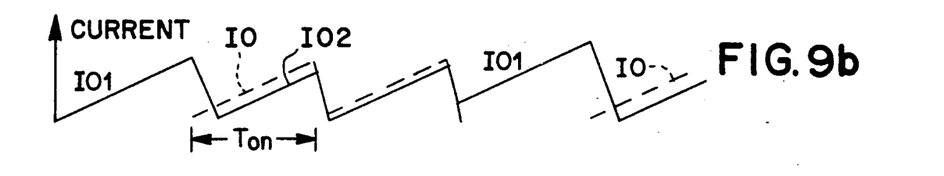

With reference to FIGS. 9a and 9b (and FIG. 8), when the ignition is fired (switch SC is turned-on) and primary current Ip flows for the approximately preferred 100 usecs, current from battery 13 also flows through inductor 49 to ground through switch SC. Inductance of inductor 49 is preferably of similar value to resonating inductor 7, e.g. about 60 uH (30 to 120 uH). At the end of the discharge period, switch 51 is turned-on, shunting the coil T inductance and resonating inductance and allowing the energy in inductor 49 to be delivered to capacitor 4 without voltage spikes. The current flow distribution is designated as 101 in FIGS. 8 and 9b. For 60 uH inductance of inductor 49 approximately 16 mj of energy are delivered in this pulse.

By operating the integrated converter with current IO (and say an on-time Ton of 100 usecs), two pulses with an approximate energy of 10 mj per pulse can be delivered, for a total combined energy of approximately 40 mj per ignition firing, a high value during ignition firing given the simplicity of the circuit. Note that the integrated converter energy delivery switch 36a is across the primary winding of the transformer in this case. It should also be noted that by employing a switch 52 as shown, the synchronous converter can also be operated as a (low efficiency) boost converter to produce the current waveforms IO2 shown.

Figure 10:
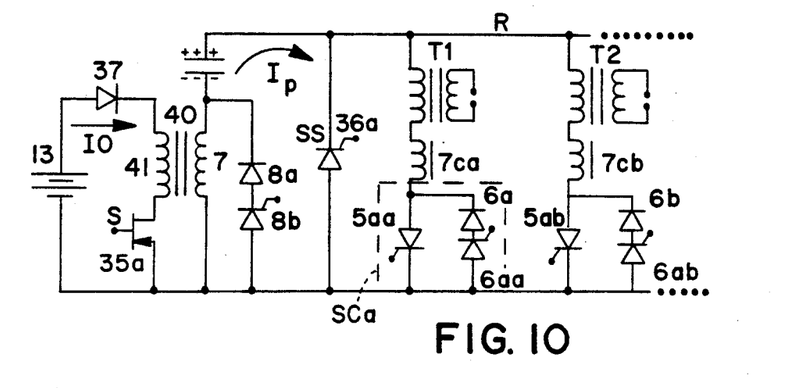
FIG. 10 is a circuit drawing of an alternative to the integrated converter of FIGS. 4, 5 in which connection to the resonating inductor is by transformer coupling.

An alternative method of coupling to inductor 7 is shown in FIG. 10. Like numerals represent like parts with respect to FIG. 5. Coupling is made by means of an additional winding 41 which now defines a transformer with (formerly purely inductor) winding 7. Advantages are that switch 35a (N-type FET shown) can be located with its source to ground, and a turns ratio of other that one-to-one can be employed (modifying the voltage reflected onto the winding 41). A high voltage fast switching IGBT may be particularly useful for switch 35a.

In this embodiment a distributorless ignition with cascaded coils T1, T2, ..., are shown and with bi-directional switches to control the current in both directions of the CD spark discharge, i.e. bi-directional switch SCa of coil T1 with forward conducting SCR 5aa and reverse conducting combination SCR 6aa and diode 6a, and likewise for coil T2, SCR 5ab and SCR 6 ab/diode 6b. This permits a larger value of inductors 7ca, 7cb (corresponding to inductor 7c of FIG. 5) which may be high leakage inductance, e.g. 5 to 25 uH, of coils T1, T2, or separate inductors. Disadvantages of this design are the introduction of the leakage inductance of the transformer 40 and the need for the additional winding (which preferably should be wound in a bi-filar way to reduce the leakage, as is well known to those versed in the art).

For purposes of clarification regarding the firing of the ignition, the term "ignition spark firing" shall mean one complete firing of a spark plug, which in the present case is preferably made up of many "spark pulses" or a train of "spark pulses" comprising the (total) ignition spark firing. As disclosed in the references and discussed somewhat herein, a preferred duty cycle of the spark pulses is 50% down to 25%, i.e. spark pulse firing or pulse discharge time (of approximately 100 usecs) divided by the time between firings (200 to 400 usecs for the duty cycle range quoted).

It should be noted that with reference to the previous figures that in fact it is not feasible to operate the integrated converter, i.e. to turn on switch S, during any part of the spark discharge cycle, including the latter part of the spark discharge cycle since the voltage across the resonating inductor 7 during the last quarter spark discharge cycle is such as to maintain the last quarter cycle discharge current in the inductor.

It should also be noted that the two topologies for the CD system, as exemplified by FIG. 7 (the "alternative topology") and FIG. 8 (the "standard topology"), are often, but not always, interchangeable so that equivalents of the single coil examples shown, e.g. FIG. 8, may also be developed for the preferred alternative topology layout for the distributorless ignitions with cascaded coils (e.g. FIG. 10). In the case of the synchronous converter stage of FIG. 8 applied to, for example, FIG. 10, the series connection of the battery 13, inductor 49, and diode 50 would be made between ground (with the negative of the battery connected to ground as in mostly done, with rare exceptions) and the rail R, with the cathode of the diode 50 connected to the rail. Control and operation would differ somewhat in this case.

Figure 11:
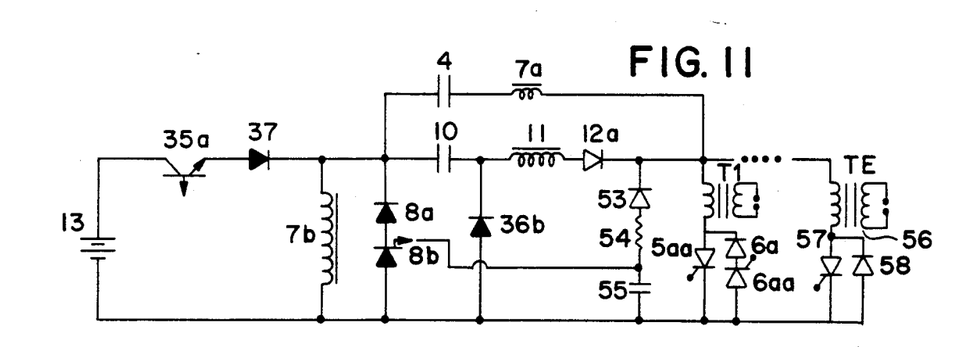
FIG. 11 is a circuit drawing of an integrated converter ignition system utilizing an alternative form of recharge circuit.

FIG. 11 is a circuit drawing of an integrated converter ignition system utilizing an alternative form of recharge circuit to that of FIGS. 1 and 7. Like numerals represent like parts with reference to these and the other figures.

The main distinctive feature is the parallel connection of the recharge circuit (10/11/12a) and the discharge circuit capacitor 4 and inductor 7a such that the during the integrated converter operation the energy stored in resonating inductor 7b is delivered only to the recharge capacitor via a diode means 36b versus a more complex shunt switch 36. Also shown in the figure is the series connection of diode 53, resistor 54, and capacitor 55 between the output of the recharge circuit and ground which places a negative bias on the trigger of shunt SCR 8b following its firing and current conduction to speed up its recovery (the recovery time being available to SCR 8b is one quarter, versus one half, a spark discharge period). In this respect, inductor 7b is preferably larger, e.g. about 100 uH, to provide sufficient time recovery time, i.e. 35 usecs.

Figure 12A:
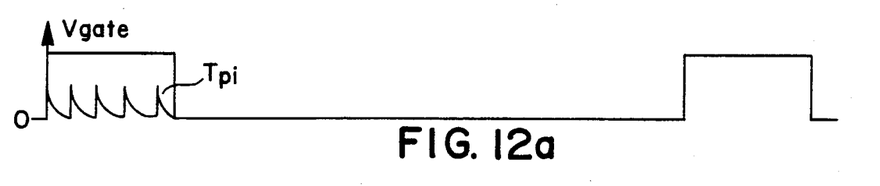
FIGS. 12a and 12b are conventional and reversed polarity gate outputs respectively of the variable gate of FIG. 1 useful in integrating an exhaust gas spark firing with the VHE ignition systems disclosed herein.
Figure 12B:
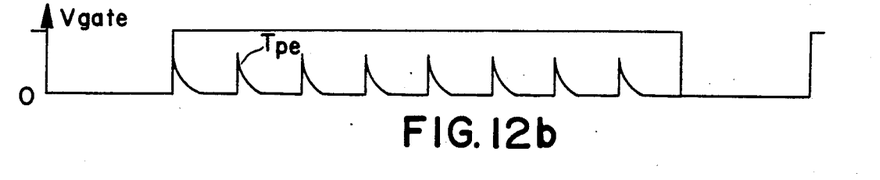

A feature of the VHE ignition is the ability to provide substantially higher spark power and energy in the form of multiple pulses, especially when used with a recharge circuit as shown in FIG. 11. This may be particularly useful in applications where sparking is used in engine exhaust streams, e.g. in exhaust manifolds, to ignite and burn-off unburnt hydrocarbons, as disclosed for example in U.S. Pat. Nos. 3,146,072 on a "Fume Eliminator" by R. F. Morgan and 3,263,412 on "Methods and Means For Eliminating Smog" by C. J. Thompson. As shown in FIG. 11 an additional coil TE, 56, is required in parallel with the other coils Ti, with its SCR 57 and shunt diode 58 (which may not require a switch in series with it). In the preferred mode of operation, the exhaust spark would be operated for a short period, e.g. 10 seconds to 2 minutes, after engine start-up until the exhaust catalyst has warmed up. A particular simple way to operate coil TE, the exhaust spark, is to invert the gate output of FIG. 12a (used to trigger the ignition coils Ti with pulses Tpi) and to apply the inverted gate shown in FIG. 12b to produce a somewhat wider spaced sequence of trigger pulses Tpe to trigger coil TE. The wider spaced pulses can insure that the recharge capacitor 10 can remain in an essentially fully charged state during the exhaust spark firing to not compromise the ignition firing.

The high output voltage, e.g. 36 kVolts, of VHE ignition and its ability to sustain a spark discharge under high flow conditions make it particularly suited for exhaust gas reburning by allowing spark gaps of 0.25 inch and greater to be used. By anchoring the spark discharge to a point across the spark plug tip of the spark plug type of FIG. 3, fouling of the spark plug is minimized.

Finally, it is particularly emphasized with regard to the present invention, that since certain changes may be made in the above apparatus and method without departing from the scope of the invention herein disclosed, it is intended that all matter contained in the above description, or shown in the accompanying drawings, shall be interpreted in an illustrative and not limiting sense.

What is claimed is:

1. A capacitive discharge, CD, ignition system including a CD circuit defined by at least one energy storage and discharge capacitor of capacitance C, at least one separate resonating inductor of inductance Le, one or more ignition coils Ti where i=1,2,3, ..., of turns ratio N defined by the secondary coil winding turns Ns divided by the primary turns Np, and coil primary current switch means SCi, said CD circuit having a spark pulse firing discharge period T and being further defined by the series connection of: 1) the resonating inductor Le with one of its ends connected to ground, 2) the said capacitor C, 3) the primary winding of a coil Ti, and 4) said switch SCi with one of its ends connected to ground, the CD ignition system including an essentially DC power source means for supplying power to the ignition system to charge up said capacitor C, and in which the high voltage side of said power source means is connected through switch means S to the intersection of said inductor Le and capacitor C defined as the "feed point", the low voltage side of the power means is connected to ground, and a shunt switch SS is connected across the primary windings of said coils Ti and switches Si, the system being constructed and arranged such that: a) upon the ignition system operation said switch S is off for the spark discharge cycle of the spark pulses comprising a train of spark pulses per ignition firing, and at subsequent times is turned-on to conduct current through said inductor from said power source until a predetermined peak current IO is reached which stores energy E1 equal to ½*Le*(IO)**2 in said inductor, whereupon switch S is turned off and switch SS, which was off, is turned-on, and said current IO flows in a complete circuit including said capacitor C to deposit the charge on the positive plate of the capacitor to help restore its charge, and b) during the period following the ignition firing the switches S and SS are turned on and off sequentially to store energy E1 in inductor Le in time Ton when S is on (Son) and SS is off (SSoff) and to deliver the energy E1 to the capacitor in the time Toff when S is off (Soff) and SS is on (SSon), said sequential operation continuing until the capacitor is fully charged.

2. A capacitive discharge, CD, ignition system including a CD circuit defined by at least one energy storage and discharge capacitor of capacitance C, at least one separate resonating inductor of inductance Le, and one or more ignition coils Ti where i=1, 2, 3, ..., of turns ratio N defined by the secondary coil winding turns Ns divided by the primary turns Np, coil primary current switch means SCi, said CD circuit having a spark pulse firing discharge period T, and said CD ignition system including an essentially DC power source means for supplying power to the ignition system by charging up said capacitor C, the improvement comprising the connection of said power source through switch S across the ends of said inductor defining an integrated converter, the system constructed and arranged such that upon the ignition system operation said switch means S is off for the spark discharge cycle of any spark pulses, and at a subsequent time is turned-on to conduct current through said inductor from said power source until a predetermined peak current IO is reached which stores energy E1 equal to ½*Le*(IO)**2 in said inductor, whereupon switch S is turned off and said current IO flows in a complete circuit including said capacitor C to deposit charge on the positive plate of the capacitor to help restore its charge.

3. An ignition system as defined in claim 2 further comprising a switch SS shunting at least the primary windings of said coils Ti such that upon switch S turn-off and switch SS turn-on current IO flowing in the resonating inductor flows through switch SS to deposit its charge to the discharge capacitor C.

4. An ignition system as defined in claim 3 wherein said discharge circuit comprises the series connection of: 1) the resonating inductor Le with one of its ends connected to ground, 2) the said capacitor C, 3) the primary winding of a coil Ti, and 4) said switch SCi with one of its ends connected to ground, and wherein the high voltage side of said power source means is connected at the intersection of said inductor Le and capacitor C through switch S.

5. An ignition system as defined in claim 3 wherein said switch means SS includes a silicon control rectifier, or SCR.

6. An ignition system as defined in claim 5 wherein said CD ignition comprises a very high power high energy, VHE, ignition with discharge capacitor of capacitance C approximately 5 uF charged to approximately 400 volts and resonating inductor having inductance Le approximately equal to 60 uH and leakage inductance Lpe of primary windings of coils Ti being much less than Le.

7. An ignition system as defined in claim 6 wherein the parameters defining said ignition system are further selected to provide voltage doubling, defined as the parameter (N**2)*Cs/C being less than 0.2, wherein N is the ratio of turns of the secondary-to-primary winding of coil Ti and Cs is the total output capacitance of the secondary circuit connected to the high voltage output of said coils Ti.

8. An ignition system as defined in claim 5 wherein said discharge capacitor is capacitor of capacitance C between 2 and 8 uF and said resonating inductor has inductance Le such that when taken with said capacitor C they have a resonant frequency fcc of between 8 and 16 kHz.

9. An ignition system as defined in claim 8 wherein the peak current IO flowing in the resonating inductor as a result of the operation of the integrated converter is in the range of approximately 5 amps to approximately 25 amps.

10. An ignition system as defined in claim 9 wherein during ignition firing switch S is turned on at the end of the spark discharge period following initiation of each spark pulse discharge and turned off when an energy E1 between 5 and 25 millijoules is stored in the resonating inductor, and switch S is kept off for the few usecs required to deliver the energy to capacitor C, and then switch S is sequentially turned on and off to partially or wholly recharge the capacitor C between spark pulse firings and between ignition firings.

11. An ignition system as defined in claim 10 wherein said voltage source is a car battery.

12. An ignition system as defined in claim 10 wherein said voltage source is a combination of two or more batteries of voltage V0 between 24 and 50 volts.

13. An ignition system as defined in claim 2 wherein said switch S is series combination of a transistor and diode.

14. An ignition system as defined in claim 2 including a recharge circuit comprised of a capacitor C0, inductor L0, and a diode for recharging said discharge capacitor C between the spark pulse firings.

15. An ignition system as defined in claim 14 wherein said discharge capacitor C and recharge capacitor C0 have a common connecting point to one end of inductor Le, and wherein said recharge capacitor C0 has a diode DS connected from its other end to the other end of said inductor Le such that an operation of the integrated converter the energy E1 stored in the inductor Le is delivered to the recharge capacitor C0 through said diode DS when switch S is turned off.

16. An ignition system as defined in claim 15 wherein there is included an additional coil TE whose output is connected to a sparking device in the exhaust system of an engine and is operated after the completion of a train of spark pulses of any ignition coil Ti and prior to a subsequent sparking train of pulses.

17. A capacitive discharge, CD, ignition circuit comprised of a series connection from ground of a coil primary current switch means SC comprised of a switch SC1 and shunt diode, an energy storage and discharge capacitor C, a primary winding of a coil T, and a resonating inductor of inductance Le with its one end returned to ground, said CD circuit having an inductor of inductance L0 connected to the intersection of said switch and capacitor defined as the auxiliary feed point, and said inductor connected to a voltage source, the system being constructed and arranged such that when switch SC is turned on to produce a spark pulse current flows through inductor L0 during the discharge period and is delivered to said capacitor after the end of the spark pulse.

18. A very high power high energy, VHE, ignition system comprising a CD ignition circuit and including one or more toroidal spark plugs, each spark plug having a central tip at the end of an insulating nose section of length l1 protruding from the end of a surrounding shell and defining a gap "g" between surface of said nose section and inside surface of said shell at the shhell end, where l1 is approximately equal to or greater than twice the size of gap g, the system constructed and arranged to fire a train of spark pulses between said tip and shell end such that in normal operation of an IC engine, and a defined acceptable life-time of the plug, material deposited on the insulating nose is readily oxidized to form essentially non-conducting or poorly conducting oxides whose resistance along the nose length is of the order of magnitude and greater than 10,000 ohms, i.e. greater than 1,000 ohms.

19. An ignition system as defined in claim 18 wherein said spark plug tip comprises a thin layer of erosion-resistant material whose oxides are essentially insulating, which forms a toroidal spark gap of gap length l1 about ⅛" with the end of the spark plug shell and a gap width g of approximately 0.04".

20. An ignition system as defined in claim 19 wherein very thin layers of pre-treating material are deposited on the insulating nose to reduce the breakdown voltage of the plug and wherein the resistance of the nose section of the plug as a result of the pre-treatment is of the order of or greater than 10,000 ohms, and wherein further deposits formed on the pretreatment material form essentially insulating oxides.

21. An ignition system as defined in claim 20 wherein said tip and/or other material include tungsten.

22. A capacitive discharge, CD, ignition system including a CD circuit defined by at least one energy storage and discharge capacitor of capacitance C, at least one separate resonating inductor of inductance Le usable for also connecting a power supply to it for charging capacitor C, and one or more ignition coils Ti for igniting air-fuel mixtures in engines where i=1, 2, 3, ..., of turns ratio N defined by the secondary coil winding turns Ns divided by the primary turns Np, coil primary current switch means SCi, said CD circuit having a spark pulse firing discharge period T and a gate period Tgon over which a train of multiple firing spark pulses is produced for igniting air-fuel mixtures and a period Tgoff over which no mixture igniting spark firing occurs, and said CD ignition system including an essentially DC power source means for supplying power to the ignition system by charging up said capacitor C, said system further including coil TE and switch means for energizing the coil, said coil TE having its output connected to a sparking device in the exhaust system of said engine wherein said coil is energized and fired during the period Tgoff when the mixture ignition sparks are not fired to ignite unburnt fuel in the exhaust stream.

23. The system as defined in claim 22 wherein there is included a recharge circuit and wherein coil TE is multiple fired to produce an exhaust gas firing pulse train for part of or essentially all of the period Tgoff.

24. The system as defined in claim 23 wherein the period between pulses of said exhaust gas firing pulse train is selected so that following firing of said coil TE and prior to firing of coil Ti the discharge capacitor C has been essentially fully recharged.

25. The system as defined in claim 24 wherein said ignition is of the very high power high energy VHE type exhibiting voltage doubling with spark current of the order of magnitude of one amp.

* * * * *